United States Patent [19]
Chai et al.

[11] Patent Number: 6,046,947
[45] Date of Patent: Apr. 4, 2000

[54] INTEGRATED CIRCUIT MEMORY DEVICES HAVING DIRECT ACCESS MODE TEST CAPABILITY AND METHODS OF TESTING SAME

[75] Inventors: Joon-wan Chai; Kye-hyun Kyung, both of Kyungki-do, Rep. of Korea

[73] Assignee: Samsung Electronics Co., Ltd., Rep. of Korea

[21] Appl. No.: 09/198,702

[22] Filed: Nov. 24, 1998

[30] Foreign Application Priority Data

Dec. 3, 1997 [KR] Rep. of Korea ............ 97-65539

[51] Int. Cl.$^7$ ................................................ G11C 7/00
[52] U.S. Cl. ............... 365/201; 365/189.05; 365/230.08
[58] Field of Search ............... 365/201, 189.05, 365/189.02, 230.05, 230.08

[56] References Cited

U.S. PATENT DOCUMENTS

| | | | |
|---|---|---|---|
| 5,416,741 | 5/1995 | Ohsawa | 365/201 |
| 5,469,445 | 11/1995 | Nicolaidis | 371/22.3 |
| 5,506,499 | 4/1996 | Puar | 324/158.1 |
| 5,574,692 | 11/1996 | Dierke | 365/201 |
| 5,642,057 | 6/1997 | Oke et al. | 324/762 |
| 5,668,815 | 9/1997 | Gittinger et al. | 371/21.2 |
| 5,708,614 | 1/1998 | Koshikawa | 365/201 |
| 5,877,987 | 3/1999 | Merritt | 365/189.05 |

FOREIGN PATENT DOCUMENTS 09213072 8/1997 Japan .

OTHER PUBLICATIONS

European Search Report, EP 98 30 3712, Sep. 28, 1998.

*Primary Examiner*—David Nelms
*Assistant Examiner*—Anh Phung
*Attorney, Agent, or Firm*—Myers Bigel Sibley & Sajovec

[57] ABSTRACT

Integrated circuit memory devices include test mode control circuits to more efficiently route test data to a fewer number of output pins during test mode operation. The memory device may include first and second memory arrays having first and second pluralities of data lines electrically coupled thereto, respectively. First and second pluralities of latch units are also provided. The first plurality of latch units are electrically coupled together in series as a first pipelined latch unit and electrically coupled in parallel to the first memory array by the first plurality of data lines. The second plurality of latch units are electrically coupled together in series as a second pipelined latch unit and electrically coupled in parallel to the second memory array by the second plurality of data lines. A preferred test mode control circuit electrically couples an output of the first pipelined latch unit to an input of the second pipelined latch unit, in response to a test mode control signal (φDAE). This test mode control circuit enables the transfer of data from the first pipelined latch unit to the second pipelined latch unit during direct access test mode reading operations. This data can then be transferred from the first pipelined latch unit to an output driver and then serially transmitted to a single input/output pin. Additional memory arrays within the memory device may also be linked together during test mode operation to improve testing efficiency when multiple memory devices are tested simultaneously in a memory testing apparatus.

27 Claims, 5 Drawing Sheets

INTEGRATED CIRCUIT MEMORY DEVICES HAVING DIRECT ACCESS MODE TEST CAPABILITY AND METHODS OF TESTING SAME

CROSS-REFERENCE TO RELATED APPLICATIONS

This application is related to Application Ser. No. 09/198,704, entitled "CIRCUITS FOR TESTING MEMORY DEVICES HAVING DIRECT ACCESS TEST MODE AND METHODS FOR TESTING SAME" (Attorney Docket No. 5649-545), filed concurrently herewith, the disclosure of which is hereby incorporated herein by reference.

FIELD OF THE INVENTION

The present invention relates to integrated circuit devices, and more particularly to integrated circuit memory devices and methods of testing integrated circuit memory devices.

BACKGROUND OF THE INVENTION

Functional testing of integrated circuit memory devices prior to shipping to an end user typically requires a comparison of data written to a memory device with data read from the memory device during test mode operation. Unfortunately, as integrated circuit memory devices become more highly integrated with larger numbers of memory arrays (i.e., memory blocks) therein, operations to efficiently test multiple memory devices simultaneously after packaging may become more difficult since the number of test pins connected to each memory device in a testing apparatus typically increases as the number of memory cell arrays within a memory device increases.

Thus, notwithstanding attempts to efficiently test integrated circuit memory devices using test apparatus, there continues to be need for more highly integrated memory devices which can be efficiently tested using conventional testing apparatus and fewer numbers of test pins.

SUMMARY OF THE INVENTION

It is therefore an object of the present invention to provide improved integrated circuit memory devices and methods of testing same.

It is another object of the present invention to provide integrated circuit memory devices which can operate in a preferred test mode to thereby enable efficient and simultaneous testing of multiple memory devices by a testing apparatus.

These and other objects, advantages and features of the present invention are provided by integrated circuit memory devices which utilize test mode control circuits therein to more efficiently route test data to a fewer number of output pins during test mode operation. In particular, a preferred memory device comprises at least first and second memory arrays having first and second pluralities of data lines electrically coupled thereto, respectively. First and second pluralities of latch units are also provided. The first plurality of latch units are electrically coupled together in series as a first pipelined latch unit and electrically coupled in parallel to the first memory array by the first plurality of data lines. The second plurality of latch units are electrically coupled together in series as a second pipelined latch unit and electrically coupled in parallel to the second memory array by the second plurality of data lines. A preferred test mode control circuit is also provided. This test mode control circuit electrically couples an output of the first pipelined latch unit to an input of the second pipelined latch unit, in response to a test mode control signal ($\phi$DAE). This test mode control circuit enables the efficient transfer of data from the first pipelined latch unit to the second pipelined latch unit during direct access test mode reading operations. This "pipelined" data can then be transferred from the second pipelined latch unit to an output driver and then serially transmitted from the output driver to a single input/output pin. Many additional memory arrays within high capacity memory devices may also be linked together during test mode operation to improve testing efficiency when multiple memory devices are tested simultaneously in a memory testing apparatus.

A preferred test mode control circuit may comprise a tri-state buffer (or pass gate) having an input electrically coupled to the output of the first pipelined latch unit and an output electrically coupled to the input of the second pipelined latch unit. In addition, a pass transistor (e.g., a PMOS pull-up transistor or NMOS pull-down transistor) is electrically coupled in series between the output of the tri-state buffer and a first reference potential (e.g., Vdd or GND) and is responsive to the test mode control signal ($\phi$DAE). The second pipelined latch unit may comprise a latch unit cell (e.g., LAT7) which is responsive to a test clock signal (TCLK) and a test read signal ($\phi$TRL) and has a first data input (D1) electrically coupled to a first one of the first plurality of data lines (e.g., RWD7) and a second data input (D2) electrically coupled to an output of the test mode control circuit. In contrast, the first pipelined latch unit may comprise a latch unit cell (e.g., LAT7) which is configured so that the second data input D2 of the latch unit cell is electrically coupled to the first reference potential (e.g., Vdd or GND). To achieve efficient operation, each of the latch unit cells may comprise a first D-type latch (e.g., LT7) having a data input terminal electrically coupled to the first data input (D1) of the latch unit cell (e.g., LAT7), a multiplexer (MUX7) having a first input terminal (1) electrically coupled to an output terminal of the first D-type latch and a second input terminal (0) electrically coupled to the second data input (D2) of the latch unit cell and a second D-type latch (e.g., F/F7) having a data input terminal electrically coupled to an output of the multiplexer. The first D-type latch also has an enable input (EN) which is responsive to the test read signal ($\phi$TRL), the second D-type latch has a clock input which is responsive to a 1→0 transition of the test clock signal (TCLK) and the multiplexer has a select input which is responsive to the test read signal ($\phi$TRL). Here, the first D-type latch (e.g., LT7) may be a latch which outputs data when the enable input (EN) is high and the second D-type latch (e.g., F/F7) may be a latch which outputs data in response to a rising (or falling) edge of a clock input signal (e.g., TCLK).

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may referred to by the same reference symbols.

Figure 1:
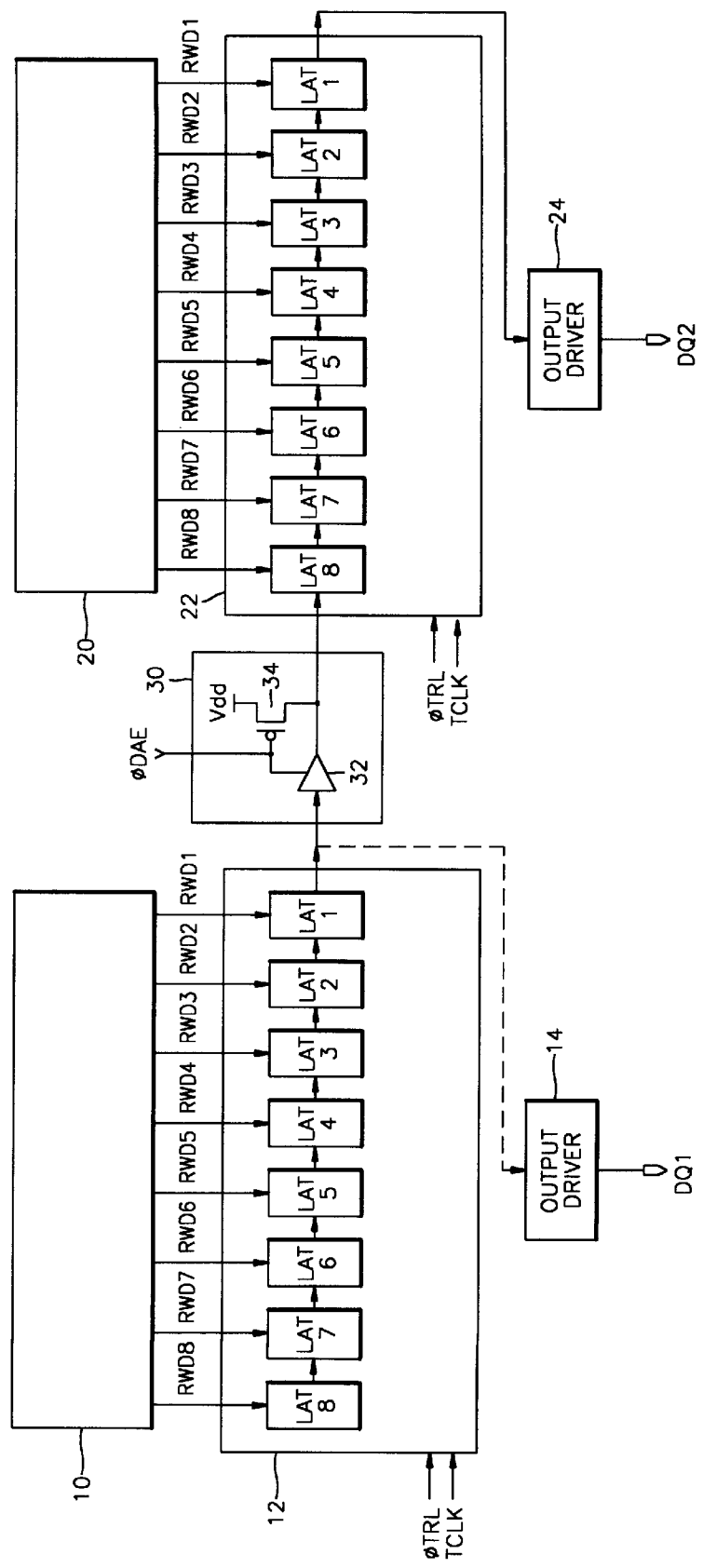
FIG. 1 is an electrical schematic of an integrated circuit memory device according to a first embodiment of the present invention.

Referring now to FIG. 1, a preferred integrated circuit memory device according to an embodiment of the present invention includes first and second memory cell arrays 10 and 20, respectively, and first and second pipelined latch units 12 and 22. The first pipelined latch unit 12 comprises a first plurality of latch unit cells LAT1–LAT8 and the second pipelined latch unit 22 comprises a second plurality of latch unit cells LAT1–LAT8. The first plurality of latch unit cells LAT1–LAT8 in the first pipelined latch unit 12 are electrically coupled in parallel to the first memory cell array 10 by a plurality of data lines RWD8–RWD1 and are responsive to a test clock signal TCLK and a test read signal φTRL. Similarly, the second plurality of latch unit cells LAT1–LAT8 in the second pipelined latch unit 22 are electrically coupled in parallel to the second memory cell array 20 and are responsive to the test clock signal TCLK and the test read signal φTRL. First and second output drivers 14 and 24 are also provided.

During normal reading operations, first data may be transferred in parallel from the first memory cell array 10 to the first pipelined latch unit 12 and then serially transferred in a pipelined manner from the eighth latch unit cell LAT8 to the first latch unit cell LAT1 (in-sync with test clock signal TCLK) and then to the first output driver 14. This first data is then serially transmitted by the first output driver 14 to a first input/output pin DQ1 of the memory device. During these normal reading operations, second data may also be transferred in parallel from the second memory cell array 20 to the second pipelined latch unit 22 and then serially transferred from the eighth latch unit cell LAT8 to the first latch unit cell LAT1 (in-sync with the test clock signal TCLK) and then to the second output driver 24. This second data is then serially transmitted by the second output driver 24 to a second input/output pin DQ2 of the memory device. Accordingly, during normal reading mode, data can be simultaneously transferred from "N" memory arrays within the memory device to "N" respective input/output pins DQ1-DQN.

However, because it is advantageous to be able to test a large number of memory devices simultaneously in a testing apparatus (not shown) during test mode operation, the preferred memory device of FIG. 1 also includes a test mode control circuit 30 which comprises a pass gate such as a tri-state buffer 32 and a pass transistor such as a PMOS pull-up transistor 34 which is electrically connected to a positive power supply potential (e.g., Vdd), as illustrated. The pass transistor may also comprise an NMOS pull-down transistor (not shown). Here, the tri-state buffer 32 and the pull-up transistor 34 are responsive to a test mode control signal φDAE. According to this arrangement of the test mode control circuit 30, a logic 1 test mode control signal φDAE enables the passing of data from an output of the first pipelined latch unit 12 to an input of the second pipelined latch unit 22. Thus, during direct access test mode operations, data from multiple memory arrays within an integrated circuit memory device may be passed serially through multiple pipelined latch units and then to a single input/output pin DQ, in-sync with the test clock signal TCLK.

Figure 2:
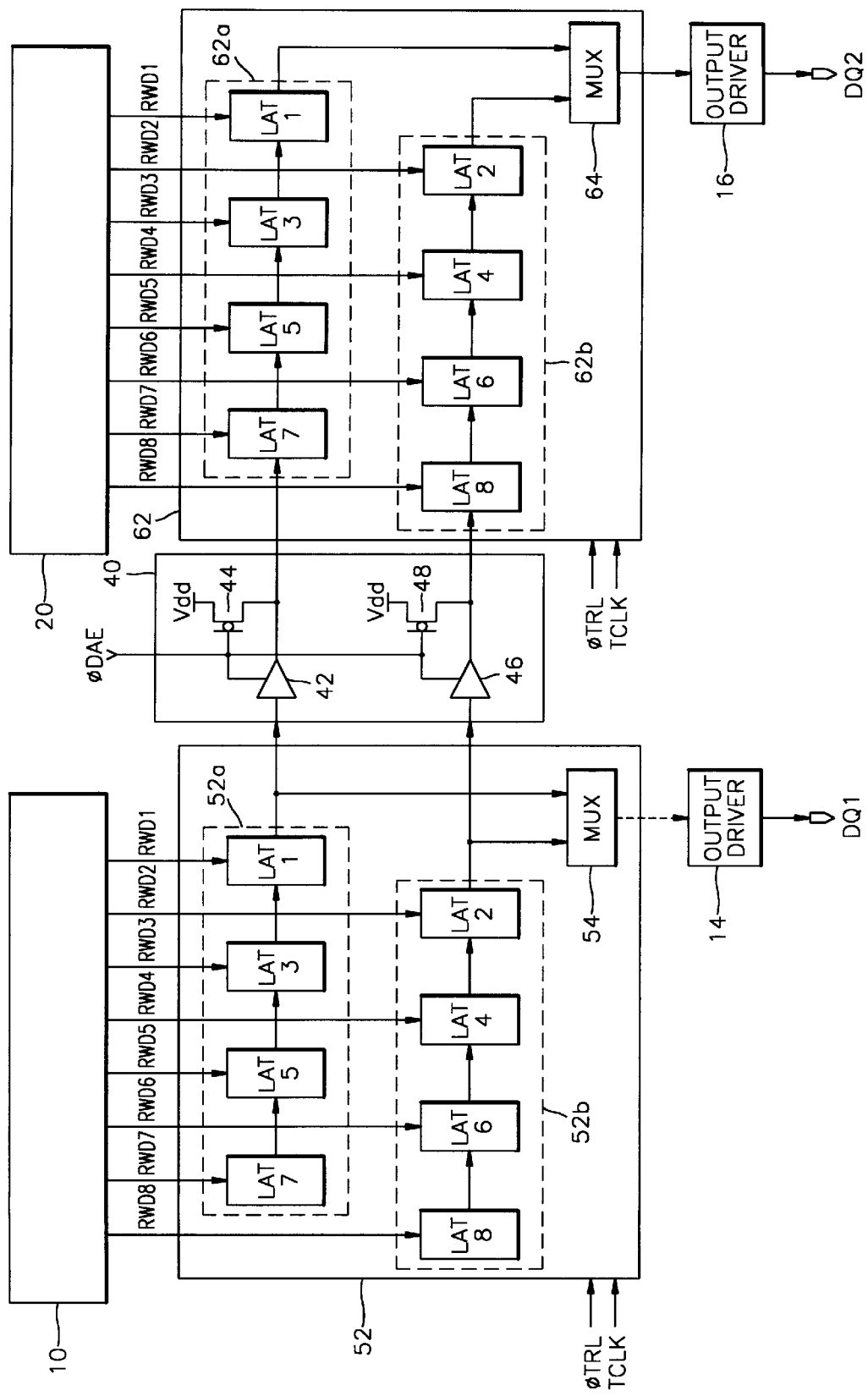
FIG. 2 is an electrical schematic of an integrated circuit memory device according to a second embodiment of the present invention.

Referring now to FIG. 2, a preferred integrated circuit memory device according to another embodiment of the present invention includes first and second memory cell arrays 10 and 20 and first and second pluralities of latch units 52 and 62 therein. The first plurality of latch units 52 comprise a first plurality of latch unit cells LAT1–LAT8 and the second plurality of latch units 62 comprise a second plurality of latch unit cells LAT1–LAT8. The first plurality of latch unit cells LAT1–LAT8 are electrically coupled in parallel to the first memory cell array 10 by a plurality of data lines RWD8–RWD1 and are responsive to the test clock signal TCLK and the test read signal φTRL. The first plurality of latch unit cells are also configured as a first odd pipelined latch unit 52a and a first even pipelined latch unit 52b, as illustrated. Similarly, the second plurality of latch unit cells LAT1–LAT8 are electrically coupled in parallel to the second memory cell array 20 and are responsive to the test clock signal TCLK and the test read signal φTRL. The second plurality of latch unit cells are also configured as a second odd pipelined latch unit 62a and a second even pipelined latch unit 62b, as illustrated. First and second multiplexers 54 and 64 are also provided along with first and second output drivers 14 and 16. The first multiplexer 54 may be configured to select the output of the first odd pipelined latch unit 52a in response to a falling edge of the test clock signal TCLK and select the output of the first even pipelined latch unit 52b in response to a rising edge of the test clock signal TCLK, as described more fully hereinbelow with respect to FIG. 3. Data from the selected outputs is then serially transmitted in an interleaved manner by the first multiplexer 54 to the first output driver 14. Likewise, the second multiplexer 64 may be configured to select the output of the second odd pipelined latch unit 62a in response to a falling edge of the test clock signal TCLK and select the output of the second even pipelined latch unit 62b in response to a rising edge of the test clock signal TCLK. Data from the selected outputs is then serially transmitted in an interleaved manner by the second multiplexer 64 to the second output driver 16.

In addition, the test mode control circuit 40 of FIG. 2 includes first and second tri-state buffers 42 and 46 and first and second pass transistors 44 and 48 which are electrically connected to a positive power supply potential (e.g., Vdd), as illustrated. Here, the tri-state buffers and the pull-up transistors are responsive to the test mode control signal φDAE. According to this arrangement of the test mode control circuit 40, a logic 1 test mode control signal φDAE enables the passing of "odd" data from an output of the first odd pipelined latch unit 52a to an input of the second odd pipelined latch unit 62a and the passing of "even" data from an output of the first even pipelined latch unit 52b to an input of the second even pipelined latch unit 62b. Thus, during direct access test mode operations, the data from multiple memory arrays within an integrated circuit memory device may be passed serially through multiple odd and even pipelined latch units and then transferred in an interleaved manner (in-sync with rising and falling edges of the test clock signal TCLK) through a multiplexer to a single input/output pin DQN. Thus, even if the memory device has high capacity, a reduced number of test pins in required during testing which means that a conventional testing apparatus can test a greater number of memory devices ("memory chips") simultaneously.

Figure 3:
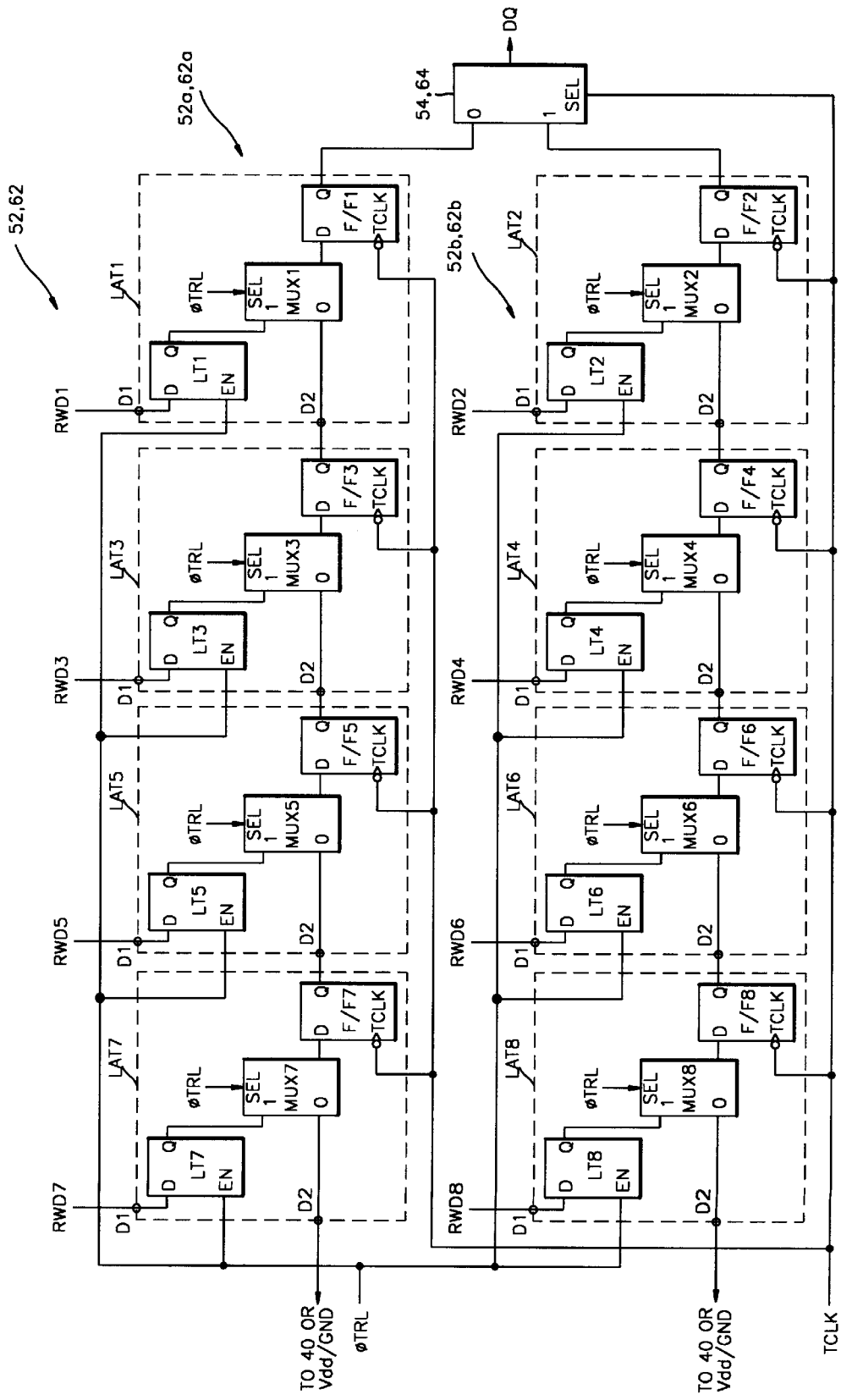
FIG. 3 is a detailed electrical schematic of the first and second pipelined latch units of FIG. 2.

Referring now to FIG. 3, the first and second plurality of latch units 52 and 62 of FIG. 2 preferably comprise odd latch unit cells LAT7, LAT5, LAT3 and LAT1 and even latch unit cells LAT8, LAT6, LAT4 and LAT2. For purposes of illustration, the seventh latch unit cell LAT7 within the second odd pipelined latch unit 62a is responsive to the test clock signal TCLK and the test read signal φTRL and has a first data input D1 electrically coupled to a first one of a plurality of odd data lines (e.g., RWD7) and a second data input D2 electrically coupled to an output of the first tri-state buffer 42. However, the seventh latch unit cell LAT7 within the first odd pipelined latch unit 52a may have has a first data input D1 electrically coupled to a first one of a plurality of odd data lines (e.g., RWD7) and a second data input D2 electrically coupled to a power supply potential Vdd or GND. More specifically, the seventh latch unit cell LAT7 may comprise a first D-type latch LT7 having a data input terminal D electrically coupled to the seventh odd data line RWD7, a multiplexer MUX7 having a first input terminal electrically coupled to an output terminal Q of the first D-type latch LT7 and a second input terminal electrically coupled to the second data input D2, and a second D-type latch F/F7 having a data input terminal D electrically coupled to an output of the multiplexer MUX7. Moreover, the first D-type latch LT7 has an enable input EN which is responsive to the test read signal φTRL, the second D-type latch F/F7 has a clock input which is responsive to a falling edge of the test clock signal TCLK and the multiplexer MUX7 has a select input which is responsive to the test read signal φTRL. Thus, the first D-type latch (e.g., LT7) may be a latch which outputs data when the enable input (EN) is high and the second D-type latch (e.g., F/F7) may be a latch which outputs data in response to a rising (or falling) edge of a clock input signal (e.g., TCLK). As will be understood by those skilled in the art, other devices, including transfer gates, may be used as substitutes for the latches.

Based on this preferred construction of the latch unit cells, a 0→1 transition of the test read signal φTRL will enable the parallel loading of data from each of the memory cell arrays into a respective pipelined latch unit. For example, a 0→1 transition of the test read signal φTRL will cause data on the seventh data line RWD7 to be loaded and passed through the first D-type latch LT7 and through the multiplexer MUX7 to the input D of the second D-type latch F/F7. A return 1→0 transition of the test read signal φTRL will then enable this loaded data to be passed to the output of the second D-type latch LT7 and through the pipelined latch unit one cell at-a-time in response to each 1→0 transition of the test clock signal TCLK. In particular, after each falling edge of the test clock signal TCLK, the output Q of the second D-type latch F/F7 in the seventh unit cell LAT7 will be transferred to the "0" input of the multiplexer MUX5 within the fifth unit cell LAT5 while the output Q of the second D-type latch F/F5 within the fifth unit cell LAT5 will be simultaneously transferred to the "0" input of the multiplexer MUX3 within the third unit cell LAT3, and so on for each of the unit cells within the corresponding odd pipelined latch unit. Similar operations occur simultaneously in the even pipelined latch unit. Moreover, if the test mode control signal φDAE is set to a logic 1 potential to enable direct access test mode operation, then data from the first odd pipelined latch unit 52a may be passed through the first tri-state buffer 42 to an input (data input D2) of the second odd pipelined latch unit 62a and data from the first even pipelined latch unit 52b may also be passed through the second tri-state buffer 46 to an input of the second even pipelined latch unit 62b. Rising and falling edges of the test clock signal TCLK can then be used to time the synchronous transfer of data from the last odd and even pipelined latch units (e.g., 62a and 62b) to the data pin DQ (via the multiplexer 64) at a frequency which equals twice the frequency of the test clock signal TCLK.

Figure 4:
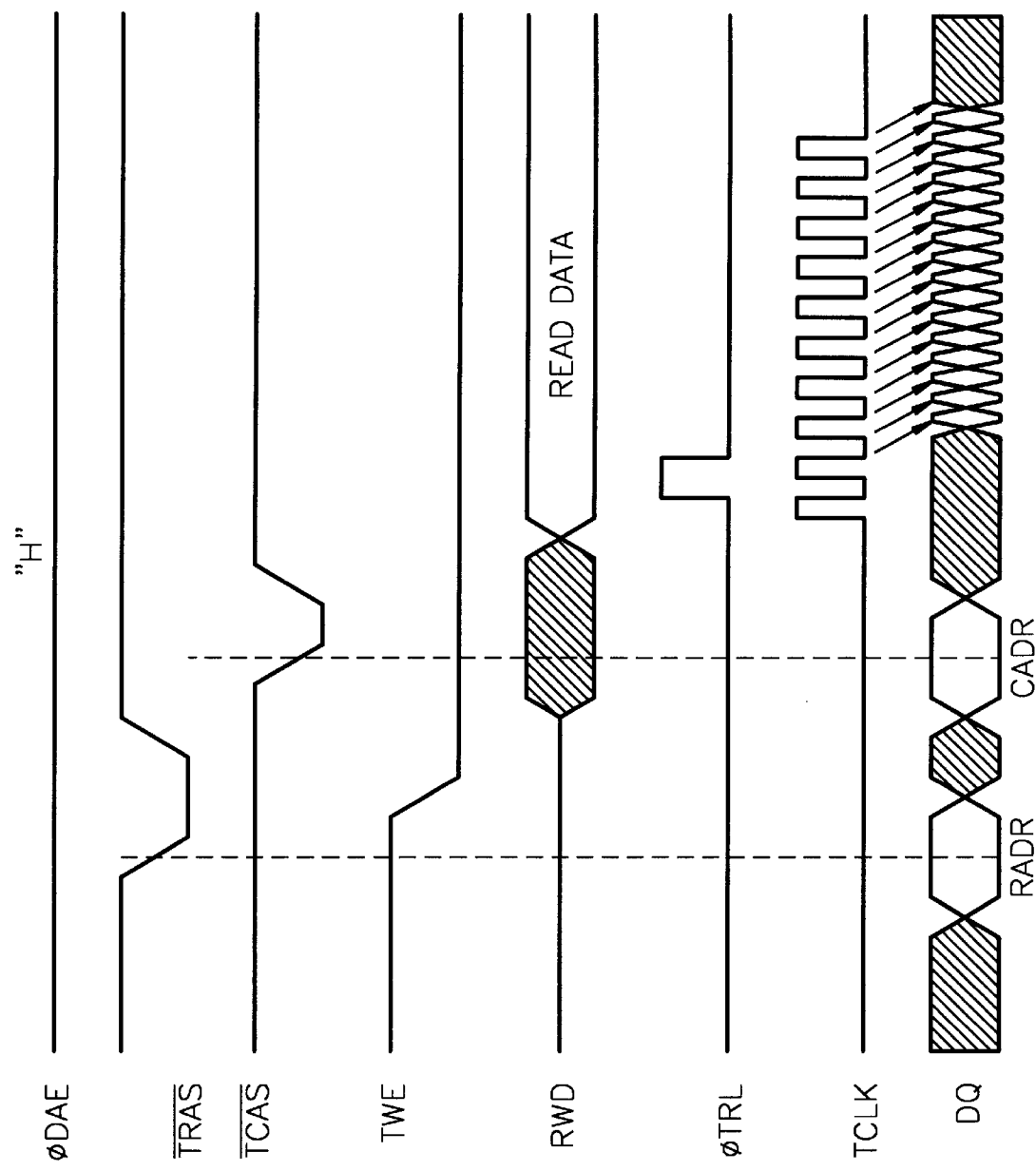
FIG. 4 is a timing diagram which illustrates operation of the pipelined latch units of FIG. 3.

Referring now to FIG. 4, a timing diagram which illustrates operation of the pipelined latch units of FIG. 3 is provided. During direct access test mode operation, the test mode control signal φDAE is set to a logic 1 potential. A falling edge of a test row address strobe signal /TRAS can then be used to trigger the loading of a row address RADR and a falling edge of a test column address strobe signal /TCAS can be used to trigger the loading of a column address CADR during a reading mode of operation when the test write enable signal TWE is set to a logic 0 potential. Then, as described above with respect to FIG. 3, a 0→1 transition of the test read signal φTRL will enable the parallel loading of data from each of the memory cell arrays into a respective pipelined latch unit. In particular, a 0→1 transition of the test read signal φTRL will cause data on the seventh data line RWD7 to be loaded and passed through the first D-type latch LT7 and through the multiplexer MUX7 to the input D of the second D-type latch F/F7. A return 1→0 transition of the test read signal φTRL will then enable this loaded data to be passed through the pipelined latch unit one cell at-a-time in response to each 1→0 transition of the test clock signal TCLK. The data from the first odd pipelined latch unit 52a will also be passed through the first tri-state buffer 42 to an input (data input D2) of the second odd pipelined latch unit 62a and data from the first even pipelined latch unit 52b will be passed through the second tri-state buffer 46 to an input of the second even pipelined latch unit 62b. Rising and falling edges of the test clock signal TCLK can then be used to time the synchronous transfer of data from the last odd and even pipelined latch units (e.g., 62a and 62b) to the data pin DQ (via the multiplexer 64) at a high transfer rate (twice the clock rate of the test clock signal TCLK).

Figure 5:
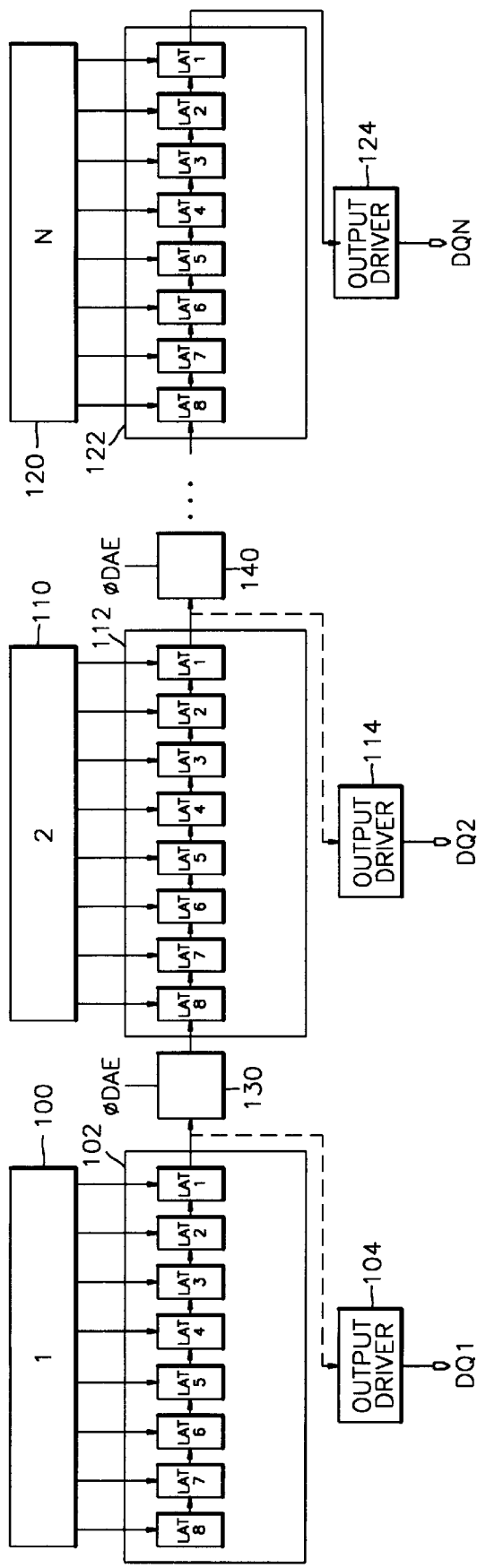
FIG. 5 is a block diagram of an integrated circuit memory device according to a third embodiment of the present invention.

Referring now to FIG. 5, a block diagram of an integrated circuit memory device according to a third embodiment of the present invention is provided. This memory device is illustrated as containing N memory cell arrays 100, 110 and 120. These memory cell arrays are electrically coupled to respective pipelined latch units 102, 112 and 122, as illustrated. During normal operating mode, the output of each pipelined latch unit can be directed to a respective output driver 104, 114 and 124, however, during direct access test mode, the test mode control signal φDAE is switched to a logic 1 potential so that data can be passed serially from an output of each pipelined latch unit to an input of the next higher pipelined latch unit in the chain. Here, the test mode control circuits 130 and 140 enable the serial transfer of data from one pipelined latch unit to another pipelined latch unit. Like the memory device of FIG. 1, data from the output of the Nth pipelined latch can be passed to the Nth output driver 124 and then to a single input/output pin DQN. Thus, regardless of the number of memory cell arrays within an integrated circuit memory device, testing of the memory device by a testing apparatus can be efficiently performed using a reduced number of input/output pins.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a first memory array having a first plurality of data lines electrically coupled thereto;
   a second memory array having a second plurality of data lines electrically coupled thereto;
   a first plurality of latch units electrically coupled together in series as a first pipelined latch unit and electrically coupled in parallel to said first memory array by the first plurality of data lines;
   a second plurality of latch units electrically coupled together in series as a second pipelined latch unit and electrically coupled in parallel to said second memory array by the second plurality of data lines; and
   a test mode control circuit which electrically couples an output of the first pipelined latch unit to an input of the second pipelined latch unit, in response to a test mode control signal.

2. The memory device of claim 1, wherein said test mode control circuit comprises a tri-state buffer having an input electrically coupled to the output of the first pipelined latch unit and an output electrically coupled to the input of the second pipelined latch unit.

3. The memory device of claim 2, further comprising a pass transistor which is electrically coupled in series between the output of said tri-state buffer and a first reference potential and is responsive to the test mode control signal.

4. The memory device of claim 1, wherein the second pipelined latch unit comprises a latch unit cell which is responsive to a test clock signal and a test read signal and has a first data input electrically coupled to a first one of the first plurality of data lines and a second data input electrically coupled to an output of said test mode control circuit.

5. The memory device of claim 4, wherein the latch unit cell comprises:
   a first D-type latch having a data input terminal electrically coupled to the first data input of the latch unit cell;
   a multiplexer having a first input terminal electrically coupled to an output terminal of the first D-type latch and a second input terminal electrically coupled to the second data input of the latch unit cell; and
   a second D-type latch having a data input terminal electrically coupled to an output of the multiplexer.

6. The memory device of claim 5, wherein the first D-type latch has an enable input which is responsive to the test read signal; and wherein the second D-type latch has a clock input which is responsive to the test clock signal.

7. The memory device of claim 6, wherein the first D-type latch is a non-gated latch; and wherein the second D-type latch is a gated latch.

8. The memory device of claim 5, wherein the multiplexer has a select input which is responsive to the test read signal.

9. The memory device of claim 6, wherein the multiplexer has a select input which is responsive to the test read signal.

10. The memory device of claim 9, wherein said test mode control circuit comprises a tri-state buffer having an input electrically coupled to the output of the first pipelined latch unit and an output electrically coupled to the input of the second pipelined latch unit.

11. The memory device of claim 10, further comprising a pass transistor which is electrically coupled in series between the output of said tri-state buffer and a first reference potential and is responsive to the test mode control signal.

12. An integrated circuit memory device, comprising:
   a first memory array having a first plurality of even and odd data lines electrically coupled thereto;
   a second memory array having a second plurality of even and odd data lines electrically coupled thereto;
   a first plurality of odd latch units electrically coupled together in series as a first odd pipelined latch unit and electrically coupled in parallel to said first memory array by the first plurality of odd data lines;
   a first plurality of even latch units electrically coupled together in series as a first even pipelined latch unit and electrically coupled in parallel to said first memory array by the first plurality of even data lines;
   a second plurality of odd latch units electrically coupled together in series as a second odd pipelined latch unit and electrically coupled in parallel to said second memory array by the second plurality of odd data lines;
   a second plurality of even latch units electrically coupled together in series as a second even pipelined latch unit and electrically coupled in parallel to said second memory array by the second plurality of even data lines;
   first test mode control circuit which electrically couples an output of the first odd pipelined latch unit to an input of the second odd pipelined latch unit, in response to a test mode control signal; and
   a second test mode control circuit which electrically couples an output of the first even pipelined latch unit to an input of the second even pipelined latch unit, in response to the test mode control signal.

13. The memory device of claim 12, further comprising:
   a first multiplexer having a select input responsive to a test clock signal, a first data input electrically coupled to the output of the first odd pipelined latch unit and a second data input electrically coupled to the output of the first even pipelined latch unit; and
   a second multiplexer having a select input responsive to the test clock signal, a first data input electrically coupled to an output of the second odd pipelined latch unit and a second data input electrically coupled to an output of the second even pipelined latch unit.

14. The memory device of claim 12, wherein said first test mode control circuit comprises a tri-state buffer having an input electrically coupled to the output of the first odd pipelined latch unit and an output electrically coupled to the input of the second odd pipelined latch unit.

15. The memory device of claim 14, further comprising a pass transistor electrically coupled in series between the output of said tri-state buffer and a first reference potential and responsive to the test mode control signal.

16. The memory device of claim 12, wherein the second odd pipelined latch unit comprises a latch unit cell which is responsive to a test clock signal and a test read signal and has a first data input electrically coupled to a first one of the second plurality of odd data lines and a second data input electrically coupled to an output of said first test mode control circuit.

17. The memory device of claim 12, wherein said second test mode control circuit comprises a tri-state buffer having an input electrically coupled to the output of the first even pipelined latch unit and an output electrically coupled to the input of the second even pipelined latch unit.

18. The memory device of claim 17, further comprising a pass transistor electrically coupled in series between the output of said tri-state buffer and a first reference potential and responsive to the test mode control signal.

19. The memory device of claim 12, wherein the second even pipelined latch unit comprises a latch unit cell which is responsive to a test clock signal and a test read signal and has a first data input electrically coupled to a first one of the second plurality of even data lines and a second data input electrically coupled to an output of said second test mode control circuit.

20. The memory device of claim 16, wherein the latch unit cell comprises:

a first D-type latch having a data input terminal electrically coupled to the first one of the second plurality of odd data lines;

a multiplexer having a first input terminal electrically coupled to an output terminal of the first D-type latch and a second input terminal electrically coupled to the output of said first test mode control circuit; and a second D-type latch having a data input terminal electrically coupled to an output of the multiplexer.

21. The memory device of claim 20, wherein the first D-type latch has an enable input which is responsive to the test read signal; and wherein the second D-type latch has a clock input which is responsive to the test clock signal.

22. The memory device of claim 21, wherein the first D-type latch is a non-gated latch; and wherein the second D-type latch is a gated latch.

23. The memory device of claim 20, wherein the multiplexer has a select input which is responsive to the test read signal.

24. The memory device of claim 21, wherein the multiplexer has a select input which is responsive to the test read signal.

25. The memory device of claim 24, wherein said first test mode control circuit comprises a tri-state buffer having an input electrically coupled to the output of the first odd pipelined latch unit and an output electrically coupled to the input of the second odd pipelined latch unit.

26. The memory device of claim 25, further comprising a pass transistor which is electrically coupled in series between the output of said tri-state buffer and a first reference potential and is responsive to the test mode control signal.

27. A method of testing an integrated circuit memory device, comprising the steps of:

transferring data in parallel from first and second memory arrays within the memory device to first and second pipelined latch units, respectively; and transferring data from the second pipelined latch unit to an output driver while simultaneously transferring data from the first pipelined latch unit into the second pipelined latch unit.

* * * * *